(12) United States Patent
Fanet et al.

(10) Patent No.: US 9,979,393 B2
(45) Date of Patent: May 22, 2018

(54) LOW POWER CONSUMPTION LOGIC CELL

(71) Applicant: Commissariat à l'Énergie Atomique et aux Énergies Alternatives, Paris (FR)

(72) Inventors: Hervé Fanet, Revel (FR); Samer Houri, Delft (NL); Gaël Pillonnet, Sassenage (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days. days.

(21) Appl. No.: 15/381,477

(22) Filed: Dec. 16, 2016

(65) Prior Publication Data

US 2017/0179954 A1 Jun. 22, 2017

(51) Int. Cl.
*H03K 19/00* (2006.01)
*H03K 19/185* (2006.01)
*H03K 19/02* (2006.01)

(52) U.S. Cl.
CPC ....... *H03K 19/0008* (2013.01); *H03K 19/185* (2013.01); *H03K 19/0013* (2013.01); *H03K 19/02* (2013.01)

(58) Field of Classification Search
None
See application file for complete search history.

(56) References Cited

U.S. PATENT DOCUMENTS

| | | | | |
|---|---|---|---|---|
| 4,021,788 A | * | 5/1977 | Marr ..................... | G11C 11/403 257/296 |
| 4,499,387 A | * | 2/1985 | Konishi ........... | H03K 19/00361 326/102 |
| 5,912,596 A | * | 6/1999 | Ghoshal ............... | H03K 3/0322 331/108 B |
| 6,043,676 A | * | 3/2000 | Mendel ............... | H03K 19/177 326/39 |
| 6,111,473 A | * | 8/2000 | Van Den Homberg ............... | H03B 5/364 331/108 C |
| 6,242,989 B1 | * | 6/2001 | Barber ..................... | H01G 5/16 331/177 V |

(Continued)

FOREIGN PATENT DOCUMENTS

| | | |
|---|---|---|
| EP | 0986077 A1 | 3/2000 |
| EP | 2549654 A1 | 1/2013 |

OTHER PUBLICATIONS

FR 1562812, Sep. 1, 2016, French Search Report.
French Search Report, dated Sep. 1, 2016, from French Application No. 1562812.

*Primary Examiner* — Crystal L Hammond
(74) *Attorney, Agent, or Firm* — Wolf, Greenfield & Sacks, P.C.

(57) ABSTRACT

The invention relates to a logic cell for an integrated circuit including at least one first variable-capacitance capacitor having first and second main electrodes separated by an insulating region, and a third control electrode capable of receiving a control voltage referenced to a reference node of the cell to vary the capacitance between the first and second main electrodes, the third electrode being coupled to a node of application of a first logic input signal of the cell, and the first and second electrodes being respectively coupled to a node of application of a cell power supply voltage and to a node for supplying a logic output signal of the cell.

14 Claims, 6 Drawing Sheets

(56) References Cited

U.S. PATENT DOCUMENTS

| | | | |
|---|---|---|---|
| 6,541,814 B1* | 4/2003 | Cao | H01L 29/94 257/312 |
| 6,842,327 B1* | 1/2005 | Diorio | H01L 27/0805 257/E27.048 |
| 8,194,386 B2* | 6/2012 | Steeneken | H01G 5/38 361/272 |
| 8,530,948 B2* | 9/2013 | Zhang | H01L 29/93 257/295 |
| 8,922,974 B2* | 12/2014 | Lan | H01P 1/127 29/25.42 |
| 9,054,069 B2* | 6/2015 | Parthasarathy | H01G 7/00 |
| 9,576,737 B2* | 2/2017 | Takagi | H01L 23/66 |
| 9,654,310 B1* | 5/2017 | Chang | H04L 25/03025 |
| 2002/0024380 A1* | 2/2002 | Kono | G05F 5/00 327/541 |
| 2003/0058022 A1* | 3/2003 | Nair | H01L 27/0811 327/310 |
| 2003/0123276 A1* | 7/2003 | Yokozeki | G11C 14/0072 365/145 |
| 2003/0210101 A1* | 11/2003 | McCorquodale | H01F 17/0006 331/117 FE |
| 2004/0160253 A1* | 8/2004 | Le | G06F 1/12 327/242 |
| 2005/0195053 A1* | 9/2005 | Uemura | H03G 1/0094 334/78 |
| 2005/0199915 A1* | 9/2005 | Kuroki | H01L 27/0207 257/213 |
| 2007/0018741 A1* | 1/2007 | Gabara | H03B 5/1841 331/177 V |
| 2007/0152763 A1* | 7/2007 | Mansuri | H03K 3/0322 331/57 |
| 2009/0322435 A1* | 12/2009 | Moussavi | H03K 3/0322 331/57 |
| 2010/0127764 A1* | 5/2010 | Suzuki | H02M 3/073 327/541 |
| 2010/0128515 A1* | 5/2010 | Fukushi | G11C 11/22 365/149 |
| 2011/0002168 A1 | 1/2011 | Schepens et al. | |
| 2011/0025378 A1* | 2/2011 | Kozawa | G06F 17/5068 326/101 |
| 2011/0309889 A1* | 12/2011 | Matsuzaki | H03K 3/017 331/111 |
| 2012/0126907 A1* | 5/2012 | Nakamoto | H03B 5/36 331/155 |
| 2013/0009724 A1* | 1/2013 | Xu | H04B 1/0458 333/32 |
| 2013/0286534 A1* | 10/2013 | Ikehashi | H01G 5/04 361/281 |
| 2015/0263702 A1* | 9/2015 | Jou | H03J 5/246 327/156 |
| 2016/0126962 A1* | 5/2016 | Masuko | H03L 7/0818 341/118 |
| 2016/0352390 A1* | 12/2016 | Park | H04B 5/0037 |
| 2017/0179841 A1* | 6/2017 | Ignatowski | H02M 5/458 |

* cited by examiner

LOW POWER CONSUMPTION LOGIC CELL

CROSS-REFERENCE TO RELATED APPLICATIONS

This application claims priority to French patent application number 15/62812, filed Dec. 18, 2015, which is hereby incorporated by reference in its entirety to the maximum extent allowable by law.

BACKGROUND

The present application relates to the field of integrated circuits comprising cells implementing logic functions, also called logic cells or logic gates. The present disclosure more particularly aims at low-consumption logic cells, and at an integrated circuit comprising such logic cells.

DISCUSSION OF THE RELATED ART

Logic circuits of the state of the art are generally formed from field-effect transistors, for example, in CMOS ("Complementary Metal-Oxide Semiconductor") technology, which associates two complementary MOS transistors, one of type N, the other one of type P, on a same support.

Figure 1:
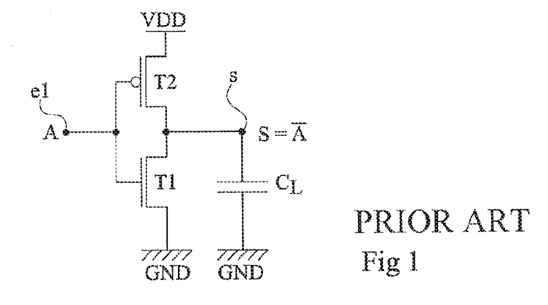
FIG. 1, previously described, is an electric diagram of an example of a logic cell.

FIG. 1 is an electric diagram of an example of an inverting logic cell, that is, a cell carrying out the NO basic function, in CMOS technology. This cell comprises a series association of an N-channel MOS transistor T1 and of a P-channel MOS transistor T2 between a node GND of application of a reference potential of the circuit (for example, the ground) and a node VDD of application of a DC power supply voltage referenced to node GND. More particularly, transistor T1 has its source connected to node GND and its drain connected to the drain of transistor T2, and transistor T2 has its source connected to node VDD. The gates of transistors T1 and T2 are connected to a same node e1 of application of an input logic signal A. The drains of transistors T1 and T2 are connected to a same node s for supplying a logic output signal S. For simplification, the cell power supply voltage is designated with the same reference VDD as the node to which it is applied. In this example, input and output signals A and S are voltages referenced to node GND. In FIG. 1, a capacitor $C_L$ connected between output node s and reference node GND has been shown, schematically representing the output capacitance of the cell. In practice, output capacitance $C_L$ does not correspond to a component specifically formed and connected to output node s of the cell, but represents the sum of the stray capacitances of the different elements connected to node s, particularly interconnection tracks, transistors T1 and T2, or also another logic cell (not shown) having its input connected to node s.

The inverter of FIG. 1 operates as follows. When input signal A is in a high state, for example, at a value close to power supply voltage VDD, transistor T2 is blocked and transistor T1 conducts. As a result, signal S is held at a low level, close to 0 V. When input signal A is in a low state, for example at a value close to 0 V, transistor T1 is blocked and transistor T2 conducts. As a result, signal S is held in a high state, close to VDD. The cell of FIG. 1 thus effectively carries out an inverter function, that is, logic output signal S is equal to complement $\overline{A}$ of logic input signal A.

The inverter of FIG. 1 behaves as a resistive voltage dividing bridge with controllable resistors, the controllable resistors being formed by transistors T1 and T2. Indeed, calling $R_{T1}$ the resistance of transistor T1 and $R_{T2}$ the resistance of transistor T2, the value of the output voltage of the cell can be expressed as follows:

$$S = VDD \frac{R_{T1}}{R_{T1} + R_{T2}}$$

When transistors T1 and T2 are respectively in the blocked state and in the conducting state, resistance $R_{T1}$ is relatively large and resistance $R_{T2}$ is relatively small. Term $R_{T1}/(R_{T1}+R_{T2})$ is then close to 1, and signal S is close to VDD. When transistors T1 and T2 are respectively in the conducting state and in the blocked state, resistance $R_{T1}$ is relatively small and resistance $R_{T2}$ is relatively large. Term $R_{T1}/(R_{T1}+R_{T2})$ is then close to 0, and signal S is close to 0 V.

More generally, all the basic logic functions currently used in integrated circuits may be carried out by cells having architectures of the same type as that in FIG. 1, that is, comprising transistors assembled as resistive voltage dividing bridges.

Logic cells based on transistors assembled as resistive bridges however are limited in terms of electric power consumption. In particular, it can be shown that a cell of the type described in relation with FIG. 1 dissipates, for each state switching of its input signal, a quantity of energy E given by relation:

$$E = 0.5 * C_L * VDD^2$$

To decrease the dynamic power consumption of cells, it may be desired to decrease power supply voltage VDD of the cells. However, in practice, the decrease of the power supply voltage goes along with an increase of leakage currents in transistors, and thus of the static power consumption of cells.

Another type of logic cells, called adiabatic, has been provided to decrease the dynamic power consumption of cells. In adiabatic logic, rather than abruptly charging and discharging output capacitors $C_L$ of the cells for each state switching, as is done in conventional logic, it is desired to carry out the charges and discharges of capacitors $C_L$ progressively. To achieve this, DC power supply voltage VDD used in conventional logic is replaced with a periodic variable power supply voltage. Adiabatic logic is a dynamic logic, that is, the output states of the logic cells are only available for a fraction of the period of the clock signal formed by the power supply voltage. Calling T the charge or discharge time of capacitor $C_L$, $R_T$ the resistance of transistor T1 or T2 used to charge or discharge capacitor $C_L$, and considering a periodic AC power supply voltage varying from 0 V to VDD, it can be shown, as a first approximation, that the quantity of energy E dissipated during a state switching of a cell can be expressed with relation:

$$E = C_L * VDD^2 * \frac{2R_T C_L}{T}$$

Thus, if duration T of charge and discharge of capacitors $C_L$ of the cells is selected to be sufficiently high with respect to time constant $R_T C_L$ of the cells, the energy dissipated for each state switching can be significantly decreased with respect to conventional logic circuits of the type described in relation with FIG. 1.

The operating principles of adiabatic logic are described in various publications, and particularly in the article entitled "Low power Digital systems based on adiabatic switching principles", of W. C. Athas, IEEE transactions on VLSI systems VOL 2, N° 4 Dec. 1994.

In practice, adiabatic logic circuits formed in CMOS technology are also limited in terms of power consumption. In particular, since a MOS transistor always has a non-zero threshold voltage, there inevitably remains a residual non-adiabatic power dissipation for each switching of the cell transistors. The decrease of the threshold voltage of transistors in advanced CMOS technologies enables to decrease such a non-adiabatic dynamic power dissipation, but generally goes along with an increase of leakage currents, and thus of the static power consumption of the cells.

French patent applications FR2978311 of Jul. 22, 2011 and FR3009722 of Aug. 14, 2013, previously filed by the applicant, as well as the article entitled "Limits of CMOS Technology and Interest of NEMS Relays for Adiabatic Logic Applications", of S. Houri et al. (IEEE TRANSACTIONS ON CIRCUITS AND SYSTEMS I, DECEMEBER 2014), describe adiabatic logic circuits where the MOS transistors are replaced with microelectromechanical or nanoelectromechanical switches. The use of electromechanical switches enables to significantly decrease the static power consumption, such switches having zero or negligible leakage currents in the blocked state. Further, the voltages for controlling the turning on and off of a microelectromechanical or nanoelectromechanical switch being relatively small as compared with the threshold voltage of a MOS transistor, the residual non-adiabatic power consumption due to threshold effects may be significantly decreased with respect to adiabatic logic circuits based on MOS transistors.

In practice, the use of microelectromechanical or nanoelectromechanical switches however raises issues. Indeed, such switches often have relatively high on-state resistances, particularly due to the poor quality of the electric contact between the fixed conducting portion and the mobile conducting portion of the switch. This causes an additional power dissipation which partly cancels the gain provided by the implementation of an adiabatic logic.

SUMMARY

Thus, an embodiment provides a logic cell for an integrated circuit comprising at least one first variable-capacitance capacitor having first and second main electrodes separated by an insulating region, and a third control electrode capable of receiving a control voltage referenced to a reference node of the cell to vary the capacitance between the first and second main electrodes, the third electrode being coupled to a node of application of a first input logic signal of the cell, and the first and second electrodes being respectively coupled to a node of application of a power supply voltage of the cell and to a node for supplying a logic output signal of the cell.

According to an embodiment, the first capacitor is a capacitor having a positive capacitance variation.

According to an embodiment, the first capacitor is a capacitor having a negative capacitance variation.

According to an embodiment, the cell further comprises a second variable-capacitance capacitor having first and second main electrodes separated by an insulating region, and a third control electrode capable of receiving a control voltage referenced to a reference node of the cell to vary the capacitance between the first and second main electrodes, the third electrode of the second capacitor being coupled to a node of application of a second input signal of the cell, and the first and second electrodes of the second capacitor being respectively coupled to the node of application of the cell power supply voltage and to the node for supplying the logic output signal of the cell.

According to an embodiment, the first and second capacitors are capacitors having a positive capacitance variation and are series-connected between the node of application of the cell power supply voltage and the node for supplying the logic output signal of the cell.

According to an embodiment, the first and second capacitors are capacitors having a negative capacitance variation and are series-connected between the node of application of the cell power supply voltage and the node for supplying the logic output signal of the cell.

According to an embodiment, the first and second capacitors are capacitors having a positive capacitance variation and are connected in parallel between the node of application of the cell power supply voltage and the node for supplying the logic output signal of the cell.

According to an embodiment, the first and second capacitors are capacitors having a negative capacitance variation and are connected in parallel between the node of application of the cell power supply voltage and the node for supplying the logic output signal of the cell.

According to an embodiment, the cell comprises a reset switch coupling the node for supplying the logic output signal of the cell to the reference node of the cell.

According to an embodiment, the cell power supply voltage is a DC voltage.

According to an embodiment, the cell power supply voltage is a variable periodic voltage.

According to an embodiment, the cell further comprises a hold circuit comprising a variable-capacitance capacitor having first and second main electrodes separated by an insulating region, and a third control electrode capable of receiving a control voltage referenced to a reference node of the cell to vary the capacitance between the first and second main electrodes, the third electrode of the variable-capacitance capacitor of the hold circuit being coupled to the node for supplying the logic output signal of the cell, and the first and second electrodes of the variable-capacitance capacitor being respectively coupled to the node of application of the cell power supply voltage and to the node for supplying the logic output signal of the cell.

According to an embodiment, the power supply voltage is of trapezoidal or sinusoidal shape.

According to an embodiment, the first variable-capacitance capacitor is of micro- or nanoelectromechanical type.

According to an embodiment, the capacitance variation of the first variable-capacitance capacitor is obtained by varying the surface area of its main electrodes, or by varying the distance between its main electrodes, or by varying the dielectric constant of a material separating its main electrodes.

According to an embodiment, the variable-capacitance capacitor has leakage currents smaller than 1 nA and preferably smaller than 1 pA.

Another embodiment provides an integrated circuit comprising a series association of a plurality of logic cells of the above-mentioned type.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

The same elements have been designated with the same reference numerals in the different drawings and, further, the various drawings are not to scale. Unless otherwise specified, expressions "approximately", "substantially", "about", and "in the order of" mean to within 20%, preferably to within 10%. In the present description, term "connected" is used to designate a direct electric connection, with no intermediate electronic component, for example, by means of one or a plurality of conductive tracks, and term "coupled" or term "linked" is used to designate a connection which may be direct (then meaning "connected") or which may be performed via one or a plurality of components. In the described examples, the input and logic output signals of a logic cell correspond to voltages referenced to a reference node GND of the cell, having their level determining the value, high or low, of the logic signal. Unless otherwise specified, logic signal means a signal which can only take two values, a high value, for example corresponding to a voltage close to the cell power supply voltage, or a low value, for example corresponding to a voltage close to 0 V.

According to an aspect of the described embodiments, a novel architecture of logic circuits based on capacitance variations of one or a plurality of variable-capacitance capacitive elements, for examples, variable-capacitance capacitors, rather than on resistance variations, is provided. An advantage is that, out of principle, a current cannot permanently flow through an assembly of one or a plurality of capacitive elements coupled to one another. The static power consumption of such an architecture is thus zero or almost zero. Variable-capacitance capacitive elements having zero or negligible leakage resistances, and thus zero or negligible leakage currents, for example, leakage currents at least 100 times smaller than those of a MOS transistor, are here more particularly considered. As an example, variable-capacitance capacitive elements having leakage currents smaller than 1 nA and preferably smaller than 1 pA are here considered. It should be noted that the higher the operating frequency of logic cells, the higher the leakage currents of the variable-capacitance capacitive elements may be, without for this to cause a significant degradation of the total cell power consumption. As an example, at an operating frequency in the order of 1 GHz, leakage currents in the order of 1 nA can be tolerated without significantly degrading the cell power consumption, the dynamic power consumption during an operating period being negligible as compared with the dynamic power. For an operating frequency in the order of 1 MHz, capacitive elements having leakage currents in the order of 1 pA or less will preferably be selected.

According to a first embodiment, the logic cells are powered with a DC voltage, and the logic carried out by the cells is a so-called static logic, that is, the state of the output signals of the cells are available at any time, and not only during a fraction of a period of a clock signal.

Figure 2:
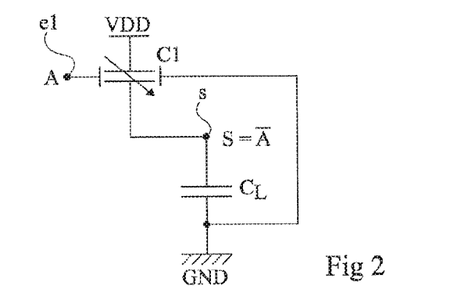
FIG. 2 is an electric diagram of an example of a logic cell according to a first embodiment.

FIG. 2 is an electric diagram of an example of a logic cell according to the first embodiment. The cell of FIG. 2 is an inverting cell. This cell comprises a variable-capacitance capacitor C1 having two main electrodes separated by an insulating region, for example, a dielectric layer, and two control electrodes electrically insulated from the main electrodes and capable of receiving a control voltage to vary the capacitance between the main electrodes. Embodiments of such capacitors will be described in further detail hereafter in relation with FIGS. 16A, 16B, 17A, 17B and 18. In the example, capacitor C1 is a capacitor having a negative capacitance variation, that is, the capacitance of capacitor C1 takes a low value when the voltage applied between its control electrodes is at a high value, and takes a high value when the voltage applied between its control electrodes is at a low value. The two main electrodes of capacitor C1 are respectively coupled, and preferably connected, to a node VDD of application of a DC power supply voltage referenced to a node GND of application of a reference potential of the cell, for example, the ground, and to a node s for supplying a logic output signal S (for example, referenced to node GND) of the cell. The control electrodes of capacitor C1 are respectively coupled, and preferably connected, to a node e1 of application of a logic input signal A (referenced to node GND) of the cell, and to reference node GND. For simplification, the cell power supply voltage is designated with the same reference VDD as the node to which it is applied. Nodes e1 and s are floating nodes, that is, they are not connected to a node of application of a reference or power supply potential of the cell. In FIG. 1, a capacitor $C_L$ connected between output node s and reference node GND has been shown, schematically representing the output capacitance of the cell. In practice, output capacitance $C_L$, rather than comprising a component specifically formed and connected to output node s, may correspond to the sum of the capacitances of the different elements connected to node s, particularly interconnection tracks, or also another capacitive logic cell (not shown) having an input which may be connected to node s. A control device, not shown, coupled to the control electrodes of capacitor C1, is provided to apply input signal A of the cell.

The inverter of FIG. 2 behaves as a capacitive voltage dividing bridge comprising a controllable capacitance corresponding to the capacitance of capacitor C1, and a fixed capacitance formed by capacitance $C_L$ of output node s of the cell. The output voltage of the inverter can be expressed as follows:

$$S = VDD \frac{C1}{C1 + C_L}$$

Neglecting the effect of the series resistors of the circuit (relatively low since it only results from electric connections), it can be shown that this relation remains true at any time, including during phases of variation of the capacitance of capacitor C1. This property explains not only the forming of the logic output states of the cell, but also that the shape of the output current is linked to the shape of the input signal and to the law expressing the capacitance variation of the capacitor as a function of the control voltage applied to the capacitor, and not to the time constant of the circuit. As a result, if the signal applied to the cell input varies sufficiently progressively between the two logic levels, such a progressivity is kept at the cell output. Thus, the transient currents flowing through the cells do not cross high values, which limits the power dissipation in the residual series resistors of the circuit. One thus obtains not only a zero or negligible static power consumption, but also a decreased dynamic power consumption as compared with architectures based on transistors.

When input signal A is in a high state, the capacitance of capacitor C1 takes a low value $C1_{low}$, and output signal S is in a low state. When input signal A is in a low state, the capacitance of capacitor C1 takes a high value C1 high higher than low value $C1_{low}$, and output signal S is in a high state. The cell of FIG. 2 thus effectively carries out an inverter function (S=$\overline{A}$).

More generally, all the basic logic functions currently used in integrated circuits may be formed by cells having architectures of the same type as that in FIG. 2, that is, based on a capacitive bridge comprising at least one capacitor of controllable capacitance. Examples of cells capable of implementing logic functions AND, OR, NAND, NOR, as well as the buffer function, will in particular be described hereafter. All the combinational and/or sequential logic functions currently used in integrated circuits may be synthesized from these basic cells. It should in particular be noted that all the combinational and/or sequential logic functions currently used in integrated circuits may be synthesized from NAND cells with two inputs and one output, or from the (NO, AND) cell pair, or also from the (NO, OR) cell pair.

Figure 3:
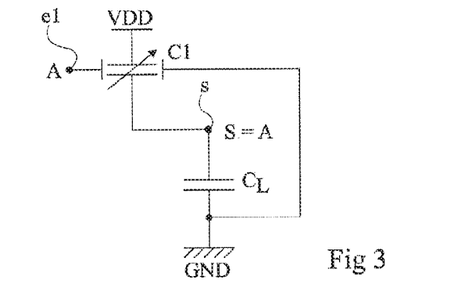
FIG. 3 is an electric diagram of another example of a logic cell according to the first embodiment.

FIG. 3 is an electric diagram of an embodiment of a buffer-type logic cell according to the first embodiment. The cell of FIG. 3 differs from the cell of FIG. 2 essentially in that, in the example of FIG. 3, capacitor C1 is a capacitor having a positive capacitance variation, that is, the capacitance of capacitor C1 takes a high value when the voltage applied between its control electrodes is at a high value, and takes a low value when the voltage applied between its control electrodes is at a low value. As in the example of FIG. 2, the cell output voltage can be expressed as follows:

$$S = VDD \frac{C1}{C1 + C_L}$$

When input signal A is in a high state, the capacitance of capacitor C1 takes a high value C high, and output signal S is in a high state. When input signal A is in a low state, the capacitance of capacitor C1 takes a low value $C1_{low}$ lower than high value $C1_{high}$, and output signal S is in a low state. The cell of FIG. 2 thus effectively carries out a buffer function (S=A). The advantages in terms of static and dynamic power consumption are the same as in the negative capacitance variation gate of FIG. 2.

Figure 4:
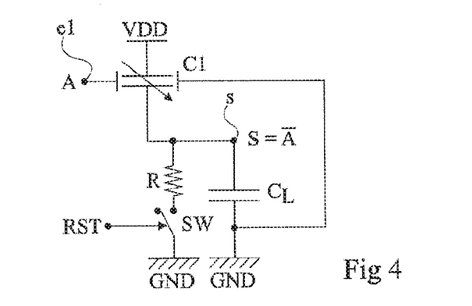
FIG. 4 is an electric diagram of an alternative embodiment of a logic cell according to the first embodiment.

FIG. 4 is an electric diagram of an alternative embodiment of the inverting cell of FIG. 2. The cell of FIG. 4 comprises the same elements as the cell of FIG. 2, arranged substantially in the same way. The cell of FIG. 4 differs from the cell of FIG. 2 in that it further comprises a reset circuit comprising a resistor R in series with a switch SW between output node s and reference node GND of the cell (in parallel with output capacitance $C_L$ of the cell). The control terminal of switch SW is coupled to a node RST of application of a cell reset control signal. The turning on of switch SW enables to reset output node s of the cell substantially to the potential of reference node GND of the cell. As a variation, the reset circuit may be adapted to resetting output node s to a reference potential other than the potential of node GND. Although it has not been shown in all the drawings, such a reset circuit may be provided in all the capacitive logic cells described in the present application, and in particular in the cells of FIGS. 3, 7, 8, 9, 10, and 12.

In order for basic logic cells to be used to implement complex functions in an integrated circuit, on the one hand, the voltages corresponding to the high and low states of a cell should be clearly discernible, and on the other hand, the cells should be able to be cascaded in series without for this to affect the discrimination of the high and low states of the output signals. In other words, the high and low states of the logic output signal of a cell should correspond to voltage levels capable of being unambiguously interpreted as being high and low states of the logic signal at the input of another cell.

In a cell of the type described in relation with FIGS. 2 to 4, capacitor C1 may easily be selected so that values $C1_{low}$ and $C1_{high}$ are such that voltages VDD*$C1_{high}$/($C1_{high}$+$C_L$) and VDD*$C1_{low}$/($C1_{low}$+$C_L$) are clearly discernible.

Figure 5:
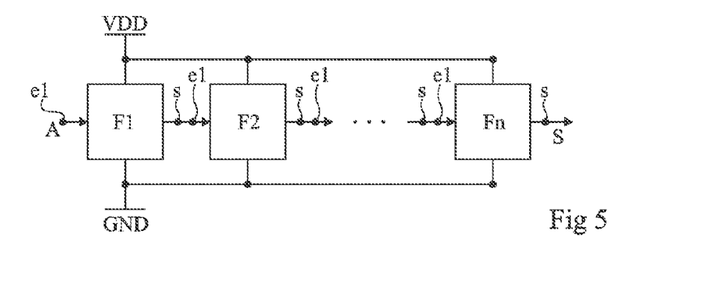
FIG. 5 is a simplified block diagram of a circuit comprising a plurality of logic cells according to the first embodiment.

FIG. 5 is a simplified block diagram of an example of a circuit comprising a plurality of logic cells according to the first embodiment, for example, buffer cells of the type described in relation with FIG. 3, series-coupled. In the shown example, the circuit comprises n series-coupled logic cells F1, F2, . . . Fn, n being an integer greater than 1. In this example, node VDD of application of the power supply voltage is common to all the circuit cells, and node GND of application of the reference potential is common to all the circuit cells. Except for cell F1, each cell Fi, i being an integer in the range from 1 to n, has its input node e1 coupled to output node s of the cell Fi−1 of rank i−1.

Figure 6:
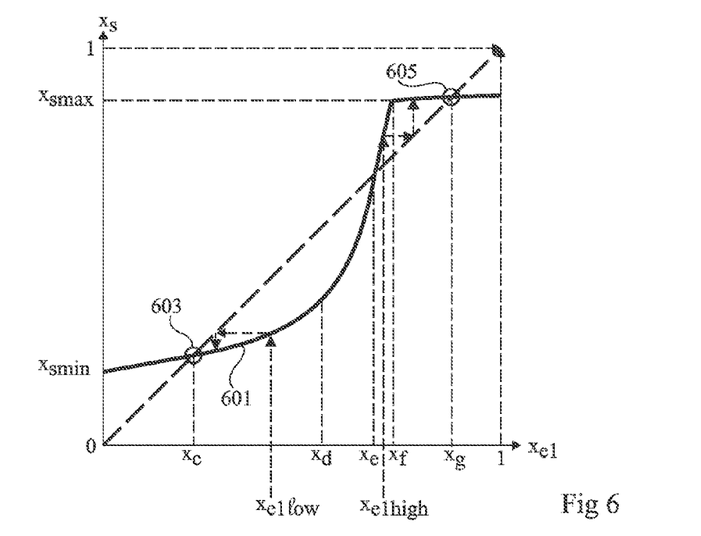
FIG. 6 is a diagram illustrating the behavior of the circuit of FIG. 5.

FIG. 6 is a diagram illustrating the behavior of the circuit of FIG. 5. More particularly, the diagram of FIG. 6 comprises a curve 601 showing the variation, for a buffer cell of the type described in relation with FIG. 3, of normalized output voltage $x_s=V_s/VDD$ (in ordinates) of the cell according to normalized input voltage $x_{e1}=V_{e1}/VDD$ (in abscissas) of the cell, $V_{e1}$ and $V_s$ respectively designating the voltage applied between input node e1 of the cell and node GND (defining logic input signal A) and the voltage supplied between output node s of the cell and node GND (defining logic output signal S). The diagonal (line of equation $x_s=x_e$) further has been drawn as a dash line in the diagram.

In the shown example, curve 601 is a monotonous rising curve. Normalized voltage $x_s$ has a minimum value $x_{smin}$ greater than 0 (in the order of 0.19 in the shown example) for $x_{e1}=0$, corresponding to the minimum value that the capacitance of capacitor C1 can take. Normalized voltage $x_s$ further has a maximum value $x_{smax}$ smaller than 1 (in the order of 0.88 in the shown example) for $x_{e1}=1$, corresponding to the maximum value that the capacitance of capacitor C1 can take. Between the points of abscissa $x_{e1}=0$ and $x_{e1}=x_d$, with $x_d$ in the range from 0 to 1, curve 601 has a slope smaller than 1, that is, smaller than the slope of the diagonal. Curve 601 cuts the diagonal for a first time at a point of abscissa $x_{e1}=x_c$, with $x_c$ in the range from 0 to $x_d$. Between the points of abscissa $x_e=x_d$ and $x_{e1}=x_f$, with $x_f$ in the range from $x_d$ to 1, curve 601 has a slope greater than 1, that is, greater than the slope of the diagonal. Curve 601 cuts the diagonal for a second time at a point of abscissa $x_{e1}=x_e$, with $x_e$ in the range from $x_d$ to $x_f$. Between the points of abscissas $x_{e1}=x_f$ and $x_{e1}=1$, curve 601 has a slope smaller than 1 again. Curve 601 cuts the diagonal for a third time at a point of abscissa $x_{e1}=x_g$, $x_g$ being in the range from $x_f$ to 1. In the shown examples, abscissas $x_c$, $x_d$, $x_e$, $x_f$ and $x_g$ respectively are in the order of 0.23, 0.54, 0.67, 0.72, and 0.87. It should be noted that the curve of FIG. 6 has been drawn for a micro- or nanoelectromechanical capacitor C1 having a positive capacitance variation of the type described hereafter in relation with FIGS. 16A and 16B. More generally, this type of curve can be obtained whatever the variable-capacitance capacitor manufacturing technology.

When a voltage $xe1=xe1_{low}$ between $x_c$ and $x_e$ is applied to input e1 of cell F1 of the circuit of FIG. 5, it can be observed that the output voltage supplied on output node S of cell Fn tends, when n increases, to converge towards a stable point 603 of abscissa $x_{e1}=x_c$ of curve 601, corresponding to the first crossing point between curve 601 and the diagonal. When a voltage $xe1=xe1_{high}$ between $x_e$ and $x_g$ is applied to input e1 of cell F1 of the circuit of FIG. 5, it can be observed that the output voltage supplied on output node S of cell Fn tends, when n increases, to converge towards a stable point 605 of abscissa $x_{e1}=x_g$ of curve 601, corresponding to the third crossing point between curve 601 and the diagonal.

Thus, the diagram of FIG. 6 shows that the capacitive logic cells of the above-described type may be cascaded in series without for this to affect the discrimination of the high and low states of the logic signals. As an example, the high and low states of the logic signals in a circuit based on capacitive logic gates of the above-described type may respectively correspond, in normalized values, to voltages greater than $xe+\Delta$, and to voltages smaller than $xe-\Delta$, $\Delta$ being a security margin, for example, in the range from 0.05 to 0.1.

Figure 7:
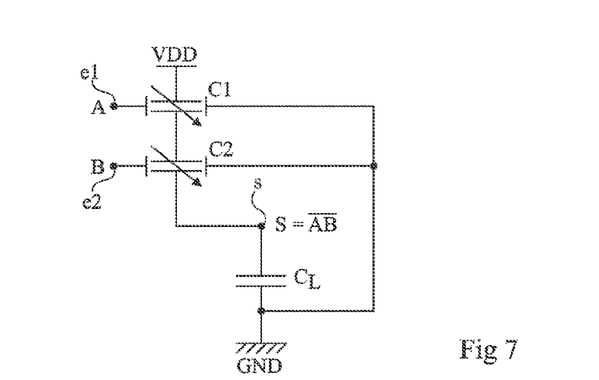
FIG. 7 is an electric diagram of another example of a logic cell according to the first embodiment.

FIG. 7 is an electric diagram of an embodiment of a NAND-type logic cell according to the first embodiment. The cell of FIG. 7 differs from the cell of FIG. 2 essentially in that it comprises, rather than a single one, two variable-capacitance capacitors C1 and C2 series-connected by their main electrodes between power supply node VDD and output node s of the cell. In the shown example, capacitor C1 is connected to power supply node VDD, and capacitor C2 is connected to output node s of the cell. In this example, capacitors C1 and C2 are both capacitors having a negative capacitance variation Capacitors C1 and C2 of the cell of FIG. 7 are for example identical or similar to capacitor C1 of the cell of FIG. 2. The control electrodes of capacitor C1 are coupled, and preferably connected, respectively to a node e1 of application of a first logic input signal A (referenced to node GND) of the cell and to node GND, and the control electrodes of capacitor C2 are coupled, and preferably connected, to a node e2 of application of a second logic input signal B (referenced not node GND) of the cell and to node GND.

The cell of FIG. 7 behaves as a capacitive voltage dividing bridge comprising a controllable capacitor corresponding to equivalent capacitance $C_{eq}=1/(1/C1+1/C2)$ of the series association of capacitors C1 and C2, and a fixed capacitance formed by capacitance $C_L$ of output node s of the cell. The cell output voltage can be expressed as follows:

$$S = VDD \frac{C_{eq}}{C_{eq}+C_L} = \frac{VDD}{1+\left(\frac{1}{C1}+\frac{1}{C2}\right)C_L}$$

When input signals A and B are in a high state, the capacitances of capacitors C1 and C2 take low values $C1_{low}$ and $C2_{low}$ (for example, $C1_{low}=C2_{low}$) and output signal S is at a first voltage level. When input signals A and B are in a low state, the capacitances of capacitors C1 and C2 take high values $C1_{high}$ and $C2_{high}$ (for example, $C1_{high}=C2_{high}$) and output signal S is at a second voltage level higher than the first level. When input signals A and B are in different states, for example, A=1 and B=0, the capacitances of capacitors C1 and C2 respectively take a low value and a high value, and output signal S is in a third voltage level between the first and second levels. Considering that the first voltage level corresponds to a low logic state of signal S, and that the second and third voltage levels correspond to a high logic state of signal S, the cell of FIG. 7 effectively carries out a NAND function ($S=\overline{AB}$).

Figure 8:
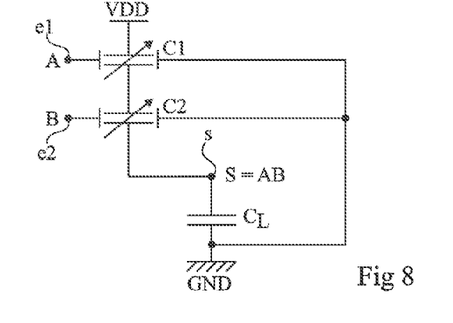
FIG. 8 is an electric diagram of another example of a logic cell according to the first embodiment.

FIG. 8 is an electric diagram of an embodiment of an AND-type logic cell according to the first embodiment. The cell of FIG. 8 differs from the cell of FIG. 7 essentially in that, in the cell of FIG. 8, variable-capacitance capacitors C1 and C2 are capacitors having a positive capacitance variation.

When input signals A and B are in a low state, the capacitances of capacitors C1 and C2 take low values $C1_{low}$ and $C2_{low}$ (for example, $C1_{low}=C2_{low}$) and output signal S is at a first voltage level. When input signals A and B are in a high state, the capacitances of capacitors C1 and C2 take high values $C1_{high}$ and $C2_{high}$ (for example, $C1_{high}=C2_{high}$) and output signal S is at a second voltage level greater than the first level. When input signals A and B are in different states, for example, A=1 and B=0, the capacitances of capacitors C1 and C2 respectively take a low value and a high value, and output signal S is at a third voltage level in the range from the first and second levels. Considering that the first and third voltage levels correspond to a low logic state of signal S, and that the second voltage level corresponds to a high logic state of signal S, the cell of FIG. 8 effectively carries out an AND function (S=AB).

Figure 9:
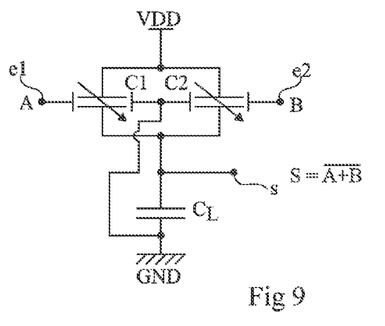
FIG. 9 is an electric diagram of another example of a logic cell according to the first embodiment.

FIG. 9 is an electric diagram of an embodiment of a NOR-type logic cell according to the first embodiment. The cell of FIG. 9 differs from the cell of FIG. 7 essentially in that, in the cell of FIG. 9, variable-capacitance capacitors C1 and C2, rather than being series-connected, are connected in parallel (by their main electrodes) between power supply node VDD and output node s of the cell.

The cell of FIG. 9 behaves as a capacitive voltage dividing bridge comprising a controllable capacitance corresponding to equivalent capacitance $C_{eq}$=C1+C2 of the parallel association of capacitors C1 and C2, and a fixed capacitance formed by capacitance $C_L$ of output node s of the cell. The output voltage of the cell can be expressed as follows:

$$S = VDD \frac{C_{eq}}{C_{eq} + C_L} = VDD \frac{C1 + C2}{C + C2 + C_L}$$

When input signals A and B are in a high state, the capacitances of capacitors C1 and C2 take low values $C1_{low}$ and $C2_{low}$ (for example, $C1_{low}$=$C2_{low}$) and output signal S is at a first voltage level. When input signals A and B are in a low state, the capacitances of capacitors C1 and C2 take high values $C1_{high}$ and $C2_{high}$ (for example, $C1_{high}$=$C2_{high}$) and output signal S is at a second voltage level higher than the first level. When input signals A and B are in different states, for example, A=1 and B=0, the capacitances of capacitors C1 and C2 respectively take a low value and a high value, and output signal S is at a third voltage level between the first and second levels. Considering that the first and third voltage levels correspond to a low logic state of signal S, and that the second voltage level corresponds to a high logic state of signal S, the cell of FIG. 9 effectively carries out a NOR function (S=$\overline{A+B}$).

Figure 10:
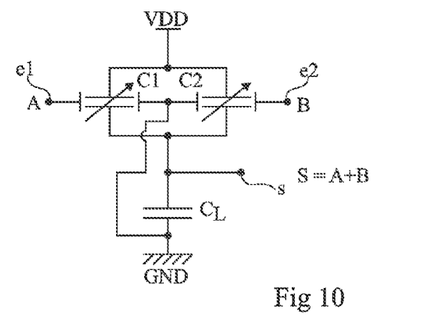
FIG. 10 is an electric diagram of another example of a logic cell according to the first embodiment.

FIG. 10 is an electric diagram of an embodiment of a logic OR-type cell according to the first embodiment. The cell of FIG. 10 differs from the cell of FIG. 9 essentially in that, in the cell of FIG. 10, variable-capacitance capacitors C1 and C2 are capacitors having a positive capacitance variation.

When input signals A and B are in a low state, the capacitances of capacitors C1 and C2 take low values $C1_{low}$ and $C2_{low}$ (for example, $C1_{low}$=$C2_{low}$) and output signal S is at a first voltage level. When input signals A and B are in a high state, the capacitances of capacitors C1 and C2 take high values $C1_{high}$ and $C2_{high}$ (for example, $C1_{high}$=$C2_{high}$) and output signal S is at a second voltage level higher than the first level. When input signals A and B are in different states, for example, A=1 and B=0, the capacitances of capacitors C1 and C2 respectively take a low value and a high value, and output signal S is at a third voltage level between the first and second levels. Considering that the second and third voltage levels correspond to a high logic state of signal S, and that the first voltage level corresponds to a low logic state of signal S, the cell of FIG. 10 effectively carries out an OR function (S=A+B).

In the examples described in relation with FIGS. 7 to 10, only cells carrying out logic functions with two inputs and one output have been described. The described examples may however be adapted to implement logic functions with more than two inputs, for example, an AND, OR, NAND, and NOR function with three inputs or more, by increasing the number of variable-capacitance capacitors connected in series or in parallel (by their main electrodes) in the cell. Further, according to the envisaged application, output node s of a capacitive logic cell may be connected to the input of a plurality of other different logic cells. This may result in increasing output capacitance $C_L$ of the cell. The high and low values of variable-capacitance capacitors C1 and/or C2 of the cell may be selected to take into account this increase of capacitance $C_L$.

It should be noted that the above-described examples use, according to the type of logic function to be implemented, either capacitors having a positive capacitance variation, or capacitors having a negative capacitance variation. For example, the AND function is carried out by capacitances having a positive capacitance variation, and the NAND function is carried out by capacitance having a negative capacitance variation.

As a variation, if, in addition to logic signals A and B, their complements $\overline{A}$ and $\overline{11}$ are also available at the input of the logic circuit, as occurs in many architectures, all the basic logic functions may be carried out by means of a same type of variable-capacitance capacitor, for example, by only using capacitors having a positive capacitance variation, or only using capacitors having a negative capacitance variation. An advantage is that this enables to simplify the technological development of logic circuits.

Figure 11:
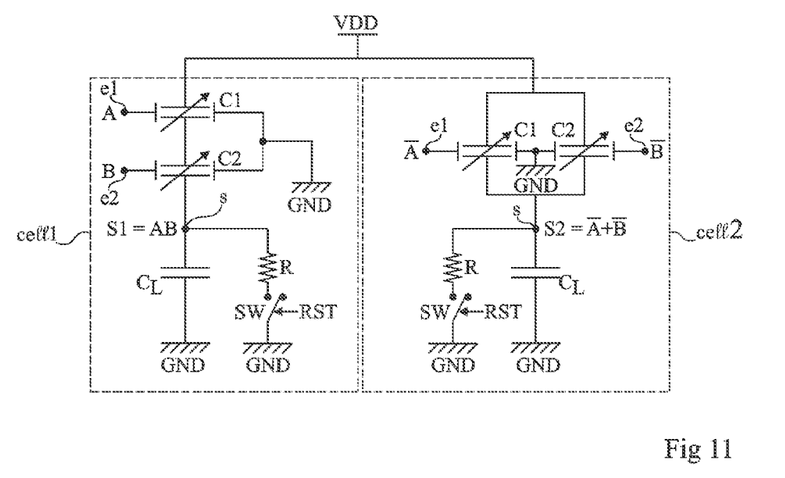
FIG. 11 is an electric diagram of an alternative embodiment of a logic cell according to the first embodiment.

FIG. 11 is an electric diagram of an embodiment of a logic circuit carrying out the AND and NAND functions by only using capacitors having a positive capacitance variation. The circuit of FIG. 11 comprises a logic cell cell1 identical or similar to the cell of FIG. 8, receiving on its input nodes e1 and e2 logic signals A and B. The circuit of FIG. 11 further comprises a logic cell cell2 identical or similar to the cell of FIG. 10, receiving on its input nodes e1 and e2 logic signals $\overline{A}$ and $\overline{B}$. Cell cell1 supplies on its output node s a logic signal S1=AB, and cell cell2 supplies on its output node s a logic signal S2=$\overline{A}$+$\overline{B}$=$\overline{AB}$. In the shown example, each of cells cell1 and cell2 is provided with a reset circuit of the type described in relation with FIG. 4.

According to a second embodiment called dynamic, the logic cells are supplied with a variable voltage, and the logic implemented by the cells is so-called dynamic logic, that is, the state of the logic signals are only available during part of the period of a periodic clock signal. As in the first embodiment, the basic logic cells according to the second embodiment may be used to synthesize all the combinational and/or sequential logic functions currently used in integrated circuits. Preferably, the dynamic logic implemented by the cells according to the second embodiment is an adiabatic logic.

Figure 12:
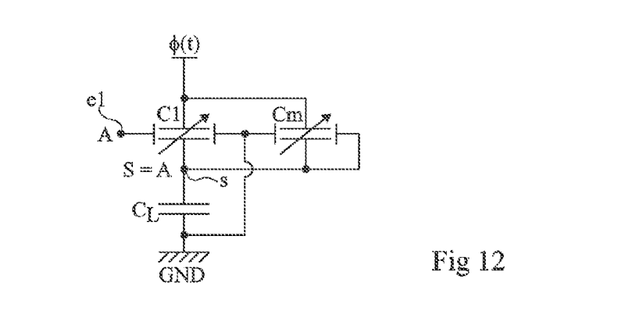
FIG. 12 is an electric diagram of an example of a logic cell according to a second embodiment.

FIG. 12 is an electric diagram of an example of a buffer-type adiabatic logic cell according to the second embodiment. The cell of FIG. 12 comprises the same elements as the buffer cell of FIG. 3, arranged substantially in the same way, but differs from the cell of FIG. 3 in that, in the cell of FIG. 12, DC power supply voltage VDD of the cell of FIG. 3 is replaced with a periodic variable power supply voltage Φ(t), supplied by a variable voltage source, not shown. Further, the cell of FIG. 12 comprises a hold and reset circuit comprising a variable-capacitance capacitor Cm, for example, identical to capacitor C1, having its main electrodes respectively connected to the node of application of power supply voltage Φ(t) and to output node s of the cell, and having its control electrodes respectively connected to output node s of the cell and to node GND.

Figure 13:
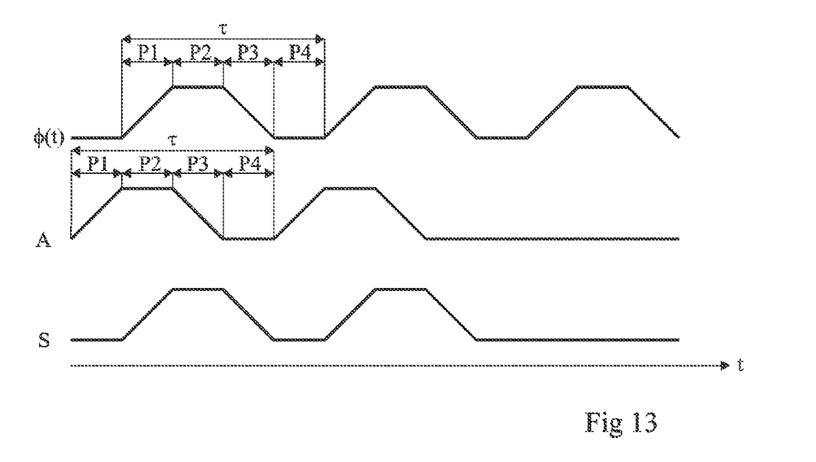
FIG. 13 is a diagram illustrating the operation of the cell of FIG. 12.

FIG. 13 is a diagram illustrating the operation of the cell of FIG. 12. More particularly, FIG. 13 illustrates the time variation of power supply voltage Φ(t), of input logic signal A, and of logic output signal S of the cell of FIG. 12.

In the shown example, power supply voltage Φ(t) is a trapezoidal voltage. More particularly, in this example, each period τ of voltage Φ(t) comprises four successive phases P1, P2, P3, and P4 substantially of same duration T=τ/4.

During phase P1, voltage Φ(t) increases linearly from a low value, for example, in the order of 0 V, up to a high value VDD. During phase P2, voltage Φ(t) remains substantially equal to its high value VDD. During phase P3, voltage Φ(t) decreases linearly from its high value VDD to its low value. During phase P4, voltage Φ(t) remains substantially equal to its low value.

Logic signals A and S are synchronized on power supply voltage Φ(t), which is also used as a clock signal. The voltages defining logic signals A and S have a periodic variation with a shape substantially identical to that of variable power supply voltage Φ(t). Logic signal A or S is in the high state when the amplitude of the periodic variable voltage defining it is at a high level, for example, close to amplitude VDD of power supply voltage Φ(t). Logic signal A or S is in the high state when the amplitude of the periodic variable voltage defining it is at a low level, for example, close to 0 V. Signal A has a phase advance in the order of τ/4 over power supply voltage Φ(t). Signal S is in phase with power supply voltage Φ(t).

In the shown example, input signal A is in the high state for two successive periods τ, and then switches to the low state.

When signal A is in the high state, the capacitance of capacitor C1 progressively increases from its low value $C1_{low}$ to its high value $C1_{high}$ during phase P1 of linear growth of signal A. At the end of phase P1, when the capacitance of capacitor C1 is in its high value $C1_{high}$, the cell output voltage is substantially equal to power supply voltage Φ(t), which, at this stage, is approximately zero (end of phase P4 of voltage Φ(t)). During phase P2 of signal A, the capacitance of capacitor C1 remains at its high value $C1_{high}$, and the output voltage of the cell substantially follows the linear growth of power supply voltage Φ(t) (phase P1 of voltage Φ(t)). During phase P3 of linear decrease of signal A, the capacitance of capacitor C1 progressively decreases from its high value $C1_{high}$ to its low value $C1_{low}$. Capacitor Cm of the hold circuit being controlled by output signal S of the cell, the capacitance of capacitor Cm is at its high value $Cm_{high}$ at the beginning of phase P3 of signal A. The placing in parallel of capacitors C1 and Cm enables to hold the equivalent capacitance between power supply node Φ(t) and output node s of the cell at a relatively high value during phase P3 of signal A. Thus, signal S remains substantially equal to the value of power supply voltage Φ(t) (that is, to value VDD) for the entire duration of phase P3 of signal A (corresponding to phase P2 of power supply voltage Φ(t)). During phase P4 of signal A, corresponding to phase P3 of power supply voltage Φ(t), voltage Φ(t) linearly decreases from its high value VDD to a substantially zero value (by discharge through capacitor Cm, which remains in its high value at the beginning of the discharge, and then takes its low value). As a result, the cell output voltage progressively decreases down to a substantially zero value. Meanwhile, the capacitance of capacitor Cm progressively decreases down to its low value $Cm_{low}$.

When signal A is in the low state, the capacitances of capacitors C1 and Cm permanently remain in their low values, so that output voltage S of the cell always remains substantially zero.

In practice, the hold and reset device may be omitted. In particular, in certain cases, a physical phenomenon may have the same hold and reset effect. For example, in electrostatic-control electromechanical devices, the electric force may be greater than the return force and hold the device in its position even when the control voltage has returned to a zero value. The bonding forces may have the same effect.

In practice, trapezoidal power supply voltage Φ(t) may be approximated by a sinusoidal voltage of period τ.

More generally, all the basic logic cells and the logic circuits described in relation with FIGS. 2 to 11 may be adapted to have an adiabatic operation of the type described in relation with FIG. 12. To achieve this, it may in particular be provided to replace DC power supply voltage VDD of the cells described in relation with FIGS. 2 to 11 with periodic variable power supply voltage Φ(t) of the cell of FIG. 12, and to optionally add to the cells described in relation with FIGS. 2 to 11 a hold circuit of the type described in relation with FIG. 12. As a variation, and as previously described, the hold function may be ensured by a physical process in the actual capacitor of the logic cell. For example, in the case of a variable-capacitance capacitor of microelectromechanical system (MEMS) type, the electrostatic attraction force due to the residual voltage between the output electrodes may be sufficient to carry out the hold function.

Further, a non-adiabatic dynamic logic may also be implemented based on variable-capacitance capacitors, by replacing variable power supply voltage Φ(t) of the cells with a DC voltage, and by introducing an additional clock signal (not shown) for the cell synchronization.

As compared with known adiabatic logic circuits, and particularly those based on micro- or nanoelectromechanical switches described in above-mentioned patent applications FR2978311 and FR3009722 and in S. Houri et al.'s above-mentioned article, which are incorporated herein by reference, the adiabatic logic based on variable-capacitance capacitors has the advantage that the residual non-adiabatic dynamic power consumption due to threshold effects is totally suppressed.

Figure 14:
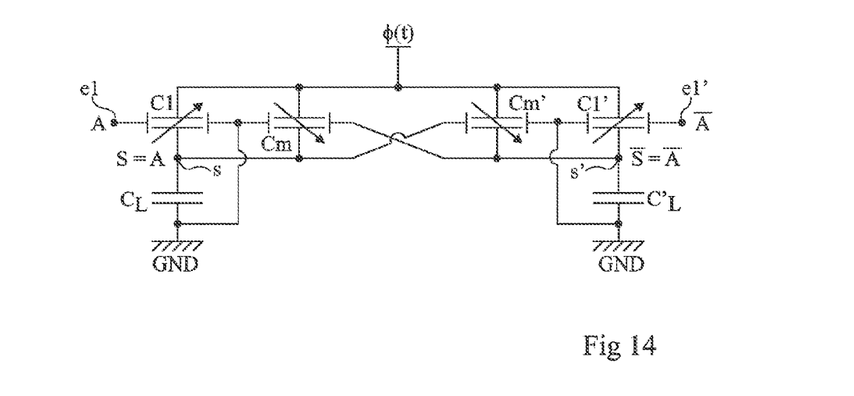
FIG. 14 is an electric diagram of another example of a logic cell according to the second embodiment.

FIG. 14 is an electric diagram of another example of a logic cell according to the second embodiment.

The cell of FIG. 14 comprises substantially the same elements as the cell of FIG. 12, but for the fact that, in the cell of FIG. 14, capacitor Cm is a capacitor having a capacitance variation opposite to that of capacitor C1. More particularly, in the shown example, capacitor C1 has a positive capacitance variation and capacitor Cm has a negative capacitance variation. Further, in the cell of FIG. 14, the control electrode of capacitor Cm opposite to node GND is not connected to output node s of the cell. The cell of FIG. 14 further comprises a complementary logic circuit comprising a variable-capacitance capacitor C1' identical or similar to capacitor C1, and a variable-capacitance capacitor Cm' identical or similar to capacitor Cm. Capacitors C1' and Cm' are coupled in parallel, by their main electrodes, between the node of application of power supply voltage Φ of the cell and a complementary output node s' of the cell. Output node s' has an output capacitance $C_L'$. The control electrodes of capacitor C1' are respectively coupled to a node e1' of application of a logic signal $\overline{A}$ complementary to signal A applied to node e1, and to node GND. Output node s' supplies an output signal $\overline{S}=\overline{X}$ complementary to signal S supplied by output node s. The control electrode of capacitor Cm opposite to node GND is connected to node s', and the control electrodes of capacitor Cm' are respectively connected to node s and to node GND.

During the phases of rise and fall of power supply signal Φ(t), the capacitance of capacitor Cm is held in its high value since it is controlled by complementary output s', which is in the low state. In this case, the power supply signal is transmitted onto output s by capacitor Cm. A reverse operation is obtained for the complementary circuit.

Figure 15:
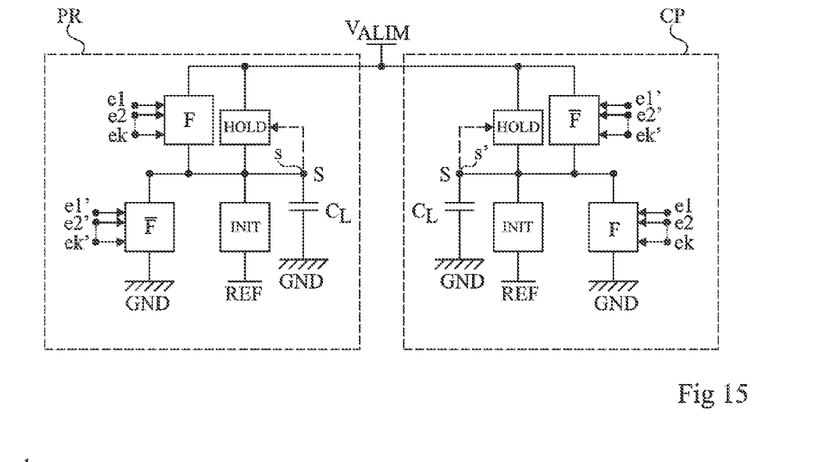
FIG. 15 is a functional diagram illustrating, in the form of blocks, a logic cell according to the first or second embodiment.

FIG. 15 is a functional diagram illustrating, in the form of blocks, different elements which may be comprised in a variable-capacitance logic cell according to the first or second embodiment.

The cell of FIG. 15 comprises a main circuit PR (shown in the left-hand portion of the drawing), and may comprise a complementary circuit CP (shown in the right-hand portion of the drawing). Complementary circuit CP enables to carry out the function complementary to that carried out by main circuit PR. This enables to implement a differential operation, and further enables to form logic circuits by only using capacitors having a positive capacitance variation, or only using capacitors having a negative capacitance variation. Only main circuit PR will be detailed hereafter, circuit CP being the complement of circuit PR.

Circuit PR comprises a block F comprising one or a plurality of variable-capacitance capacitors of the above-described type, capable of implementing a logic function F with k inputs ei (where k is an integer greater than or equal to 1 and i is an integer in the range from 1 to k) and an output s supplying a logic signal S. Block F is connected to a node $V_{ALIM}$ of application of a DC power supply voltage (in the case of a static logic cell or of a non-adiabatic dynamic logic cell) or a variable power supply voltage (in the case of an adiabatic logic cell) supplied by a voltage source, not shown.

In the case of an adiabatic logic cell, the cell may comprise a first hold circuit HOLD connected between node $V_{ALIM}$ and node s, for example, a circuit of the type described in relation with FIG. 12.

The cell may further comprise a block $\overline{F}$ with k inputs ei', capable of implementing logic function $\overline{F}$ complementary to function F. The output of block $\overline{F}$ is connected to node s. Inputs ei' are intended to receive signals complementary to the signals applied to inputs ei of block F, so that the output signals of blocks F and $\overline{F}$ are identical.

The cell may further comprise an initialization block INIT, connected on the one hand to output node s and on the other hand to a node REF of application of a reference potential, for example, the ground. Block INIT may be an initialization circuit of the type described in relation with FIG. 4, enabling to reset the potential of output node s to a reference value. It should be noted that in the case of a dynamic logic, be it adiabatic or non-adiabatic, or in the case of a state logic, the resetting of node s may for example be implemented for each clock cycle.

Figure 16A:
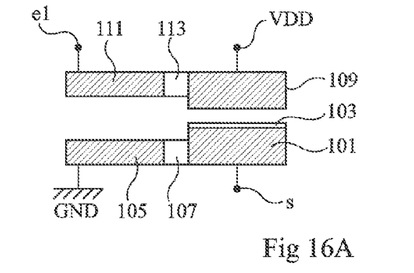
FIGS. 16A and 16B are cross-section views of an embodiment of a variable-capacitance capacitor of a logic cell according to the first or second embodiment.
Figure 16B:
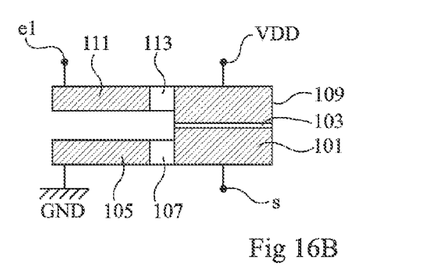

FIGS. 16A and 16B are cross-section views of an embodiment of a micro- or nanoelectromechanical variable-capacitance capacitor capable of being used in a capacitive logic cell according to the first or second embodiment.

The capacitor of FIGS. 16A and 16B is a capacitor having a positive capacitance variation. This capacitor comprises a fixed portion and a mobile portion. The fixed portion comprises a first main electrode 101 of the capacitor, and a dielectric layer 103 coating a surface (the upper surface in the orientation of the drawing) of electrode 101. Electrode 101 is intended to be connected to an external device, for example, to output node s in a capacitive logic cell of the type described in relation with FIG. 3. Electrode 101 is fixedly assembled to a metal part 105, for example, a metal plate or arm, via an insulating part 107, so that electrode 101 is electrically insulated from part 105. Part 105 forms a first control electrode of the capacitor, intended to be connected to a reference node of a circuit, for example, to node GND in a capacitive logic cell of the type described in relation with FIG. 3. The mobile portion comprises second main electrode 109 of the capacitor. Mobile electrode 109 is located opposite dielectric layer 103 coating electrode 101. Electrode 109 is intended to be connected to an external device, for example, to power supply node VDD in a capacitive logic cell of the type described in relation with FIG. 3. Electrode 109 is fixedly assembled to a metal part 111, for example, an arm or a metal plate, via an insulating part 113, so that electrode 109 is electrically insulated from part 111. Metal part 111 is located opposite metal part 105. Part 111 forms the second control electrode of the capacitor, intended to be connected to a node of application of a signal for controlling the capacitance of the capacitor, for example, input node e1 in a capacitive logic cell of the type described in relation with FIG. 3.

The application of a positive control voltage of high level, for example, close to VDD, onto metal part 111 (referenced to metal part 105), results in bringing part 111 closer to part 105, and thus electrode 109 closer to electrode 101 (for example, to place electrode 109 into contact with layer 103). This results in an increase of the capacitance formed between electrodes 101 and 109. Such a configuration is illustrated in FIG. 16B.

The application of a control voltage of low level, for example, a negative voltage or a voltage close to 0 V, onto metal part 111, results in drawing part 111 away from part 105, and thus electrode 109 away from electrode 101. This results in a decrease of the capacitance formed between electrodes 101 and 109. Such a configuration is illustrated in FIG. 16A.

In practice, the capacitor may further comprise a spring (not shown) for pulling back the mobile portion to one or the other of the two above-mentioned positions (close to the fixed portion or remote from the fixed portion). As a variation, the pulling back of the mobile portion to its initial position may be ensured by the natural stiffness of the assembly formed by elements 111, 113, and 109 of the mobile portion.

Figure 17A:
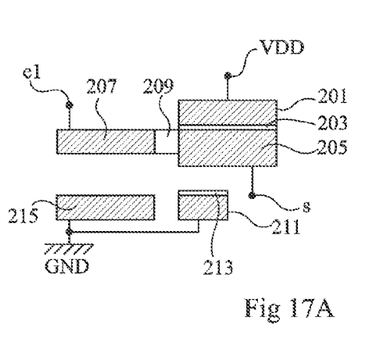
FIGS. 17A and 17B are cross-section views of an alternative embodiment of a variable-capacitance capacitor of a logic cell according to the first or second embodiment.
Figure 17B:
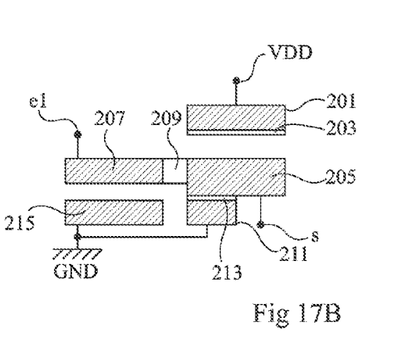

FIGS. 17A and 17B are cross-section views of another embodiment of a micro- or nanoelectromechanical variable-capacitance capacitor capable of being used in a capacitive logic cell according to the first or second embodiment.

The capacitor of FIGS. 17A and 17B is a capacitor having a negative capacitance variation. This capacitor comprises a fixed portion and a mobile portion. The fixed portion comprises a first main electrode 201 of the capacitor, and a dielectric layer 203 coating a surface (the lower surface in the orientation of the drawing) of electrode 201. Electrode 201 is intended to be connected to an external device, for example, to power supply node VDD in a capacitive logic cell of the type described in relation with FIG. 2. The mobile portion comprises second main electrode 205 of the capacitor. Mobile electrode 205 is located opposite dielectric layer 203 coating electrode 201. Electrode 205 is intended to be connected to an external device, for example, to output node s in a capacitive logic cell of the type described in relation with FIG. 2. Electrode 205 is fixedly assembled to a metal part 207, for example, a metal plate or arm, via an insulating part 209, so that electrode 205 is electrically insulated from part 207. Part 207 forms a first control electrode of the capacitor, intended to be connected to a node of application of a signal for controlling the capacitance of the capacitor, for example, input node e1 in a capacitive logic cell of the type described in relation with FIG. 2. The fixed portion of the capacitor further comprises, on the side of mobile electrode 205 opposite to electrode 201, a secondary electrode 211 coated with a dielectric layer 213 on the side of its surface facing electrode 205. Secondary electrode 211 is electrically connected to a metal part 215, for example, a metal plate or arm, located opposite metal part 207. Metal part 215 forms a second control electrode of the capacitor, intended to be connected to a reference node of a circuit, for example, to node GND in a capacitive logic cell of the type described in relation with FIG. 2. Mobile electrode 205 is capable of freely moving between electrodes 201 and 211, to draw away from electrode 201 by coming closer to electrode 211, or conversely.

The application of a positive control voltage of high level, for example, close to VDD, onto metal part 207 (referenced to metal part 215), results in drawing part 207 away from part 215, and thus in drawing electrode 205 away from electrode 201 (for example, to place electrode 205 into contact with dielectric layer 213 coating electrode 211). This results in a decrease of the capacitance formed between electrodes 205 and 201. Such a configuration is illustrated in FIG. 16B.

The application of a control voltage of low level, for example, a negative voltage or a voltage close to 0 V, onto metal part 207, results in drawing part 207 away from part 215, and thus in bringing electrode 205 closer to electrode 201 (for example, to place electrode 205 into contact with dielectric layer 203 coating electrode 201). This results in an increase of the capacitance formed between electrodes 205 and 201. Such a configuration is illustrated in FIG. 17A. In this example, dielectric layer 213 enables to guarantee the electric insulation between electrode 215 and electrode 205. The electric insulation between electrode 207 and electrode 205 is provided by element 209.

In practice, the capacitor may further comprise a spring (not shown) for pulling back the mobile portion to one or the other of the two positions shown in FIGS. 17A and 17B. As a variation, the pulling back of the mobile portion to its initial position may be ensured by the natural stiffness of the assembly formed by elements 207, 209, and 205 of the mobile portion.

Figure 18:
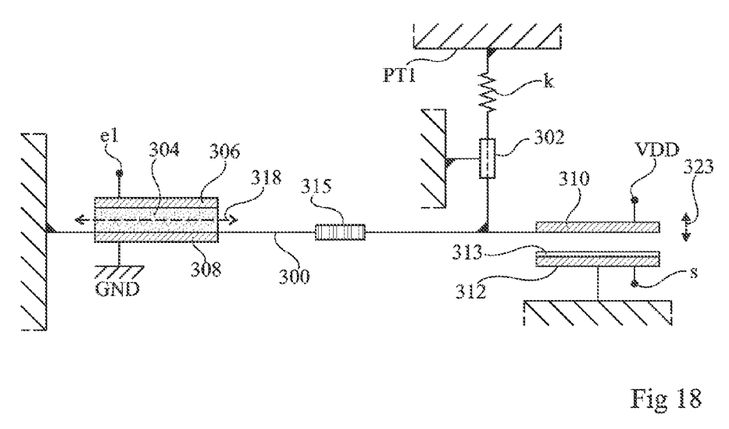
FIG. 18 is a cross-section view of another alternative embodiment of a variable-capacitance capacitor of a logic cell according to the first or second embodiment.

FIG. 18 is a simplified cross-section view of another embodiment of a variable-capacitance capacitor capable of being used in a capacitive logic cell according to the first or second embodiment.

The capacitor of FIG. 18 comprises a beam 300, for example, a metal beam, having a fixed end and having its other end free. On the side of its free end, beam 300 is coupled to a fixed point PT1 located outside of the main axis of the beam, via a return spring k. More particularly, in the shown example, spring k is an extension or compression spring having one end coupled to fixed point PT1, and having its other end coupled to beam 300 via a sliding joint 302. Thus, the free end of the beam may only displace along a direction substantially parallel to the axis of sliding joint 302. In the shown example, spring k and sliding joint 302 are arranged substantially along a same axis orthogonal to the main axis of beam 300.

The capacitor of FIG. 18 comprises a piezoelectric element 304 fixedly assembled to beam 300, preferably on the side of the fixed end of the beam (to benefit from the amplification, by the beam, of the motion generated by the piezoelectric element). Piezoelectric element 304 is arranged between two electrodes 306 and 308, substantially parallel to the main axis of beam 300. Electrodes 306 and 308 form the control electrodes of the capacitor, and are intended to be connected to an external device, for example, respectively to node e1 and to node GND in a capacitive logic cell of the type described in relation with FIG. 3.

The capacitor of FIG. 18 further comprises a mobile electrode 310 fixedly assembled to beam 300 on the side of the free end of the beam, and a fixed electrode 312 substantially parallel to electrode 310, arranged opposite mobile electrode 310. Electrodes 310 and 312 form the main electrodes of the capacitor, and are intended to be connected to an external device, for example, respectively to node VDD and to node s in a capacitive logic cell of the type described in relation with FIG. 3. In this example, the surface of electrode 312 facing electrode 310 is coated with a dielectric layer 313. Further, in this example, beam 310 comprises an electrically insulating portion 315 insulating control electrode 308 from main electrode 310.

The application of a control voltage between electrodes 306 and 308 causes an elongation or a contraction of piezoelectric element 304 along a direction parallel to the main axis of the beam, represented by arrow 321 of FIG. 18. This motion is amplified by beam 300 and by sliding joint 302, and converted into a displacement of electrode 310 along a direction parallel to the axis of sliding joint 302, represented by arrow 323 of FIG. 18. Thus, electrode 310 draws away or comes closer to electrode 312, which results in a decrease or in an increase of the capacitance formed between electrodes 310 and 312.

Figure 19:
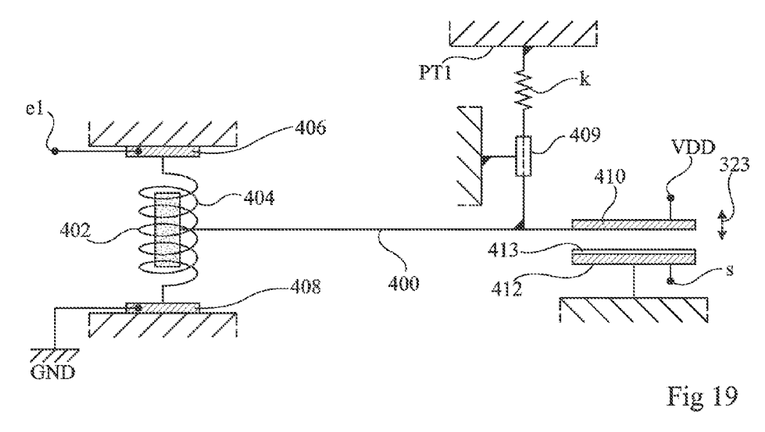
FIG. 19 is a cross-section view of another alternative embodiment of a variable-capacitance capacitor of a logic cell according to the first or second embodiment.

FIG. 19 is a simplified cross-section view of another embodiment of a variable-capacitance capacitor capable of being used in a capacitive logic cell according to the first or second embodiment.

The capacitor of FIG. 19 comprises beam 400, for example, a metal beam, having one end coupled to a mobile magnet 402. Magnet 402 is surrounded with a conductive winding 404 having a first end connected to an electrode 406 and having its second end connected to an electrode 408. In the shown example, the main axis of winding 404 is substantially orthogonal to the main axis of beam 400. Electrodes 406 and 408 form the control electrodes of the capacitor, and are intended to be connected to an external device, for example, respectively to node e1 and to node GND in a logic capacitive cell of the type described in relation with FIG. 3.

On the side of its end opposite to magnet 402, beam 400 is connected to a fixed point PT1 located outside of the main axis of the beam, via a return spring k. More particularly, in the shown example, spring k is an extension or compression spring having one end coupled to fixed point PT1, and having its other end coupled to beam 400 via a sliding joint 409. Thus, the end of the beam opposite to the magnet may only displace along a direction substantially parallel to the axis of sliding joint 409. In the shown example, spring k and sliding joint 409 are arranged along a same axis substantially orthogonal to the main axis of beam 400 and substantially parallel to the main axis of winding 404.

The capacitor of FIG. 19 further comprises a mobile electrode 410 fixedly assembled to beam 400 on the side of the free end of the beam opposite to magnet 402, and a fixed electrode 412 substantially parallel to electrode 410, arranged opposite mobile electrode 410. Electrodes 410 and 412 form the main electrodes of the capacitor, and are intended to be connected to an external device, for example, respectively to node VDD and to node s in a capacitive logic cell of the type described in relation with FIG. 3. In this example, the surface of electrode 412 facing electrode 410 is coated with a dielectric layer 413. In this example, beam 400 is not electrically coupled to any of control electrodes 406 and 408, which guarantees the electric insulation between the main electrodes and the control electrodes even when beam 400 is electrically conductive.

The application of a control current in coil 402, via electrodes 406 and 408, generates a magnetic field in coil 402 and causes a displacement of the magnet along the main axis of the coil. This results in a displacement of electrode 410 along a direction parallel to the axis of sliding joint 402. Thus, electrode 410 draws away from or comes closer to electrode 412, whereby the capacitance formed between electrodes 410 and 412 is decreased or increased.

It should be noted that, in the example of FIG. 19, the variable-capacitance capacitor is current-controlled, rather than voltage-controlled as in the previously-described examples. The logic cells described in relation with FIGS. 2 to 15 may however be adapted to the case where the variable-capacitance capacitor(s) of the cell are current-controlled.

An advantage of the embodiments described in the present application is that a variable-capacitance capacitor has leakage currents equal to zero or negligible with respect to a transistor. The static power consumption of logic cells can thus be considerably decreased as compared with transistor-based technologies.

Further, the described embodiments do not have the above-mentioned disadvantages of solutions based on microelectromechanical or nanoelectromechanical switches, due to the high contact resistances of such switches.

Specific embodiments have been described. Various alterations and modifications will occur to those skilled in the art. In particular, the described embodiments are not limited to the use of variable-capacitance capacitors of the type described in relation with FIGS. 16A, 16B, 17A and 17B, 18, and 19. More generally, any variable-capacitance capacitor comprising two main electrodes defining the variable capacitance, and two control electrodes insulated from the main electrodes, may be used to form logic cells according to the first or second embodiment. One may in particular use variable-capacitance capacitors based on variations of the electrode surface to vary the capacitance, or variable-capacitance capacitors based on variations of the distance between electrodes (case of FIGS. 16A, 16B, 17A and 17B, 18, and 19), or also variable-capacitance capacitors based on variations of the dielectric constant of the dielectric material located between the main electrodes. As an example, one may use variable-capacitance capacitors comprising piezoelectric or ferromagnetic or phase-change materials between the main electrodes of the capacitor.

Further, although only embodiments based on dual-state logic signals have been described hereabove, the described embodiments may be adapted to the implementation of a multiple-level logic, that is, where the data signals can take a number of discrete states greater than 2.

Further, in the above-described embodiments, it has been considered that output capacitance $C_L$ of the logic cells is only formed by the stray capacitances of the different elements connected to the output node of the cell. As a variation, the logic cells may comprise an additional specific capacitor, not shown, having a fixed capacitance or a variable capacitance, connected between output node s and reference node GND of the cells, in parallel with capacitance $C_L$. The provision of such an additional capacitor may in particular enable to minimize the influence of the cell environment on its behavior.

The invention claimed is:

1. A logic circuit comprising at least a first logic cell and a second logic cell cascaded in series, each logic cell comprising at least one first variable-capacitance capacitor having first and second main electrodes separated by an insulating region, and first and second control electrodes electrically insulated from its first and second main electrodes and capable of receiving a control signal for varying the capacitance between the first and second main electrodes, the first and second control electrodes being respectively coupled to a node of application of a first input logic signal of the cell and to a reference node of the cell, and the first and second main electrodes being respectively coupled to a node of application of a cell power supply voltage and to a floating node for supplying a logic output signal of the cell, wherein the first logic cell has its node for supplying a logic output signal coupled to the node of application of the first logic input signal of the second logic cell.

2. The logic circuit of claim 1, wherein at least one of the first and second logic cells further comprises a second variable-capacitance capacitor having first and second main electrodes separated by an insulating region, and first and second control electrodes electrically insulated from its first and second main electrodes and capable of receiving a control signal for varying the capacitance between the first and second main electrodes, the first and second control electrodes of the second capacitor being respectively coupled to a node of application of a second input logic signal of the cell and to the reference node of the cell, and the first and second main electrodes of the second capacitor being respectively coupled to the node) of application of the cell power supply voltage and to the node for supplying the logic output signal of the cell.

3. The logic circuit of claim 2, wherein the first and second capacitors of said at least one of the first and second logic cells are capacitors having a positive capacitance variation and are series-connected, via their main electrodes, between the node) of application of the cell power supply voltage and the node for supplying the logic output signal of the cell.

4. The logic circuit of claim 2, wherein the first and second capacitors of said at least one of the first and second logic cells are capacitors having a negative capacitance variation and are series-connected, via their main electrodes, between the node) of application of the cell power supply voltage and the node for supplying the logic output signal of the cell.

5. The logic circuit of claim 2, wherein the first and second capacitors of said at least one of the first and second logic cells are capacitors having a positive capacitance variation and are connected in parallel, via their main electrodes, between the node) of application of the cell power supply voltage and the node for supplying the logic output signal of the cell.

6. The logic circuit of claim 2, wherein the first and second capacitors of said at least one of the first and second logic cells are capacitors having a negative capacitance variation and are connected in parallel, via their main electrodes, between the node) of application of the cell power supply voltage and the node for supplying the logic output signal of the cell.

7. The logic circuit of claim 1, wherein at least one of the first and second logic cells comprises a reset switch coupling the node for supplying the logic output signal of the cell to the reference node of the cell.

8. The logic circuit of claim 1, wherein the at least first and second logic cells power supply voltage is a DC voltage.

9. The logic circuit of claim 1, wherein the at least first and second logic cells power supply voltage) is a variable periodic voltage.

10. The logic circuit of claim 9, wherein at least one of the first and second logic cells further comprises a hold circuit comprising a variable-capacitance capacitor having first and second main electrodes separated by an insulating region, and first and second control electrodes electrically insulated from its first and second main electrodes and capable of receiving a control voltage for varying the capacitance between the first and second main electrodes, the first and second control electrodes of the variable-capacitance capacitor of the hold circuit being respectively coupled to the node of application of the logic output signal of the cell and to the reference node of the cell, and the first and second main electrodes of the variable-capacitance capacitor of the hold circuit being respectively coupled to the node) of application of the cell power supply voltage and to the node for supplying logic output signal of the cell.

11. The logic circuit of claim 9, wherein at least one of the first and second logic cells comprises no specific hold circuit for holding the at least one first variable-capacitance capacitor of the cell in a state when the control signal which is applied thereto varies, a hold function being ensured by a physical phenomenon inherent to the cell.

12. The logic circuit of claim 9, wherein the power supply voltage) has a trapezoidal or sinusoidal shape.

13. The logic circuit of claim 1, wherein, in at least one of the first and second logic cells, the at least one first variable-capacitance capacitor of the cell is of micro- or nanoelectromechanical type.

14. The logic circuit of claim 1, wherein, in at least one of the first and second logic cells, the capacitance variation of the at least one first variable-capacitance capacitor of the cell is obtained by varying the surface area of its main electrodes, or by varying the distance between its main electrodes, or by varying the dielectric constant of a material separating its main electrodes.

* * * * *

UNITED STATES PATENT AND TRADEMARK OFFICE
CERTIFICATE OF CORRECTION

PATENT NO. : 9,979,393 B2  
APPLICATION NO. : 15/381477  
DATED : May 22, 2018  
INVENTOR(S) : Hervé Fanet et al.

Page 1 of 1

It is certified that error appears in the above-identified patent and that said Letters Patent is hereby corrected as shown below:

On the Title Page

Item (30) should read:  
(30) Foreign Application Priority Data  
Dec. 18, 2015 FR .................. 15 62812

Signed and Sealed this  
Tenth Day of July, 2018

Andrei Iancu  
*Director of the United States Patent and Trademark Office*